(12) United States Patent
Halliday et al.

(10) Patent No.: US 7,484,123 B2
(45) Date of Patent: Jan. 27, 2009

(54) MICRO TELECOMMUNICATIONS COMPUTING ARCHITECTURE, MICROTCA, TEST SYSTEM AND METHOD

(75) Inventors: David J. Halliday, West Leake (GB); Steve J. Lakin, Donisthorpe (GB)

(73) Assignee: Emerson Network Power - Embedded Computing, Inc., Madison, WI (US)

( * ) Notice: Subject to any disclaimer, the term of this patent is extended or adjusted under 35 U.S.C. 154(b) by 411 days.

(21) Appl. No.: 11/424,479

(22) Filed: Jun. 15, 2006

(65) Prior Publication Data

US 2008/0010525 A1 Jan. 10, 2008

(51) Int. Cl.
*G06F 11/00* (2006.01)
(52) U.S. Cl. ........................................... 714/31
(58) Field of Classification Search ............. None
See application file for complete search history.

(56) References Cited

U.S. PATENT DOCUMENTS 6,282,764 B2 * 9/2001 Ruiz et al. .................. 28/107
2004/0168105 A1 * 8/2004 Haroun et al. ............... 714/30
2006/0294424 A1 * 12/2006 Boyce ......................... 714/30

OTHER PUBLICATIONS

Van Treuren and Ley, "JTAG System Test in MicroTCA World", 2007, IEEE, Lecture 1.2 International Test Conference, pp. 1-10.*

* cited by examiner

*Primary Examiner*—Michael C Maskulinski
(74) *Attorney, Agent, or Firm*—Harness, Dickey & Pierce, P.L.C.

(57) ABSTRACT

A Micro Telecommunications Computing Architecture, MicroTCA, test system comprises an interconnect for communication between modules of the MicroTCA test system. A test controller module, such as a JTAG, Switch Module, is coupled to the interconnect and comprises an interface for coupling to at least one unit under test. An interface module, such as a MicroTCA Carrier Hub module, receives test instruction messages from an external connection and forwards these to the test controller module via the interconnect. The test instruction messages comprise test input data for at least a first unit under test. The test controller module furthermore comprises an extraction processor for extracting the test input data from the test instruction messages; and a test controller for performing a test of the first unit under test in response to the test input data.

17 Claims, 2 Drawing Sheets

MICRO TELECOMMUNICATIONS COMPUTING ARCHITECTURE, MICROTCA, TEST SYSTEM AND METHOD

FIELD OF THE INVENTION

The invention relates to a Micro Telecommunications Computing Architecture, MicroTCA test system and in particular, but not exclusively to boundary scan testing in MicroTCA hardware assemblies.

BACKGROUND OF THE INVENTION

In order to facilitate hardware implementation for telecommunication applications, the PCI Industrial Computer Manufacturers Group (PICMG™) has developed hardware standards known as Telecom Computing Architecture (TCA) standards. The standards specify a number of requirements such as mechanical features (e.g. rack size, board size), electrical features (e.g. supply voltages, max power consumptions) and interworking features (e.g. backplane communication characteristics) which allow standard hardware modules and elements from different vendors to be used together. Specifically, the MicroTCA standard has been developed to provide flexible and efficient interworking and integration of smaller modules with lower power consumptions.

Testing of hardware functionality, for example at the manufacturing stage, is important to ensure high reliability. Specifically, it is important for many platforms to support boundary scan /JTAG (Joint Test Action Group) testability for preferably both in-deployment (i.e. customer accessible) and for manufacturer test purposes. Accordingly, MicroTCA platforms can include functionality for receiving incoming test data and for transmitting output test data to an external test controller. Furthermore, as a MicroTCA platform typically comprises a plurality of different modules that all need to be tested, it is important that the functionality for performing the tests is flexible and can efficiently test different modules of the platform.

However, the prior art MicroTCA test systems tend to be relatively inflexible and/or to require high complexity in order to provide sufficient test functionality and/or external interface support.

Hence, an improved system would be advantageous and in particular a system allowing increased flexibility, reduced complexity, reduced cost and/or improved functionality would be advantageous.

SUMMARY OF THE INVENTION

Accordingly, the Invention seeks to preferably mitigate, alleviate or eliminate one or more of the above mentioned disadvantages singly or in any combination.

According to a first aspect of the invention there is provided a Micro Telecommunications Computing Architecture, MicroTCA, test system comprising: an interconnect for communication between modules of the MicroTCA test system; a test controller module coupled to the interconnect and comprising an interface for coupling to at least a first unit under test; and an interface module coupled to the interconnect and arranged to receive test instruction messages from an external connection and comprising a forwarding controller arranged to forward the received test instruction messages to the test controller module via the interconnect, the test instruction messages comprising test input data for at least a first unit under test; and wherein the test controller module furthermore comprises a extraction processor for extracting the test input data from the test instruction messages; and a test controller for performing a test of the first unit under test in response to the test input data.

The interface module may specifically be a MicroTCA Carrier Hub (MCH) module and/or the test controller module may specifically be a MicroTCA Joint Test Action Group, JTAG, Switch Module (JSM). The test input data may for example comprise test instruction data, test vector data, and/or test program data.

The invention may allow an improved test system. A flexible system may be achieved while maintaining low complexity and high performance. In particular, the invention may allow functionality to be distributed in such a way that it allows increased flexibility in building MicroTCA systems with different levels of testability.

According to an optional feature of the invention, the test input data comprises Joint Test Action Group, JTAG, test input data and the test controller may comprise a JTAG Test Access Port controller.

The JTAG test input data may for example include JTAG test instructions and/or JTAG test vectors.

The invention may allow increased flexibility, reduced complexity and/or improved performance for JTAG test functionality in a MicroTCA system.

According to an optional feature of the invention, the MicroTCA test system further comprises a redundant interface module coupled to the interconnect and arranged to receive the test instruction messages from the external connection, and comprising a forwarding controller arranged to forward the received test instruction messages to the test controller switch module via the interconnect.

The approach may allow reduced complexity and/or increased flexibility while achieving high reliability.

According to another aspect of the invention there is provided a method of testing for a Micro Telecommunications Computing Architecture, MicroTCA, test system including an interconnect for communication between modules of the MicroTCA test system; a test controller module coupled to the interconnect and comprising an interface for coupling to at least a first unit under test; and an interface module coupled to the interconnect and an external connection; the method comprising: the interface module receiving test instruction messages from the external connection, the test instruction messages comprising test input data for at least a first unit under test; the interface module forwarding the received test instruction messages to the test controller switch module via the interconnect; the test controller module extracting the test input data from the test instruction messages; and the test controller module performing a test of the first unit under test in response to the test input data.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

The following description focuses on embodiments of the invention applicable to a MicroTCA test system for JTAG boundary testing. However, it will be appreciated that the invention is not limited to this application but may be applied to many other test systems for MicroTCA systems.

Figure 1:
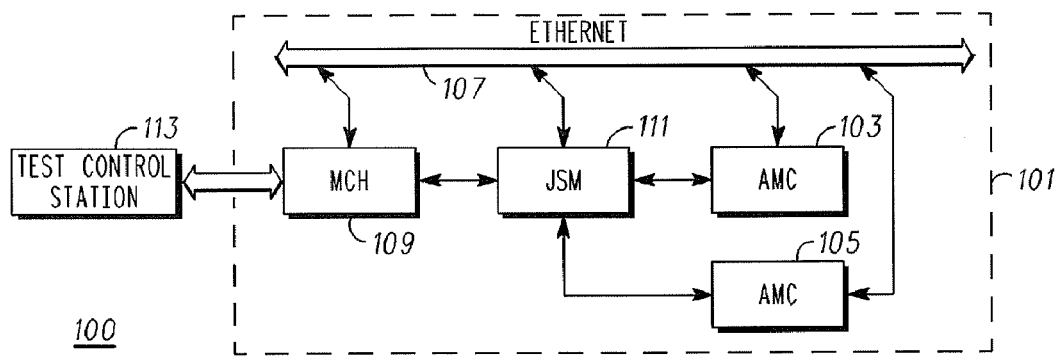
FIG. 1 illustrates an example of a block diagram of a MicroTCA hardware assembly comprising a test system in accordance with some embodiments of the invention.

FIG. 1 illustrates an example of a block diagram of a MicroTCA hardware assembly 101 comprising a test system in accordance with some embodiments of the invention.

The MicroTCA hardware assembly 101 comprises a number of Advanced Mezzanine Cards (AMCs) of which two 103, 105 are shown. Each of the AMCs perform a given function which depends on the specific embodiment and the application of the specific MicroTCA hardware assembly 101. Specifically, the AMCs may implement processing functionality such as Digital Signal Processing functionality for encoding and modulating data for transmission in a base station of a cellular communication system.

The AMCs 103, 105 are coupled to an interconnect 107 which in the specific example is a backplane of the chassis comprising the MicroTCA hardware assembly 101. The interconnect 107 allows the AMCs 103, 105 to communicate with each other and to exchange data between the cards.

The MicroTCA hardware assembly 101 furthermore comprises an interface module in the form of a MicroTCA Carrier Hub module (MCH) 109 coupled to the interconnect 107. (The MCH was previously known as a Virtual Carrier Manager (VCM) in MicroTCA terminology).

The MCH 109 provides an Intelligent Platform Management Interface (IPMI), which is capable of handling up to twelve AMCs plus the MicroTCA chassis itself, including the backplane, cooling and power modules. In addition, the MCH manages the base fabric through a switch which connects the system cards, and can also be responsible for handling the data fabric which will be used for applications running on the system. Thus, the MCH 109 comprises switch functionality allowing the AMCs to communicate with each other.

The MCH 109 accordingly implements many of the functions which are essential for the operation of the MicroTCA hardware assembly 101 and tend to be very complex modules that are costly to develop and manufacture.

The MicroTCA hardware assembly 101 of FIG. 1 furthermore comprises functionality for performing various test operations on the AMCs 103, 105. Specifically, the MicroTCA hardware assembly 101 comprises a test controller module which can perform JTAG test operations on the different AMCs 103, 105. Specifically, the Joint Test Action Group (JTAG) has in IEEE standard no. 1149.1 provided a specification for a test approach that allows boundary scan testing, programmable device upgrades and fault insertion testing. Boundary scan testing is typically performed at the time of board assembly but can also be performed in deployment.

Accordingly, the MicroTCA hardware assembly 101 comprises a test controller module which specifically is a JTAG Switch Module (JSM) 111. The JSM 111 is coupled to each of the AMCs 103, 105 via a JTAG test connection and comprises functionality for performing JTAG tests of the AMCs 103, 105 over each of these JTAG test connections. The JSM 111 introduces additional complexity to the MicroTCA hardware assembly 101 in order to provide a complex test functionality. However, the introduction of a JSM to a MicroTCA hardware assembly may be optional such that it is only used for assemblies where the enhanced test functionality is required. Indeed, in some embodiments, the JSM 111 may be inserted in the MicroTCA hardware assembly 101 during manufacturing in order to perform detailed and reliable manufacturing tests but may be removed upon the completion of the manufacturing process such that the final delivered MicroTCA hardware assembly 101 does not incur the additional cost or complexity of the JSM 111.

The test functionality of the MicroTCA hardware assembly 101 of FIG. 1 can be controlled from an external source. Specifically, the MCH 109 comprises an interface to an external connection that can interface to an external test control station 113. The test control station 113 can be operated by a test operator in order to control the JSM 111 to perform the desired tests. Specifically, the test control station 113 can transmit JTAG test data which can control the operation of the JSM 111.

The test input data from the test control station 113 is received by the MCH 109 in test instruction messages that are generated by the test control station 113. The test instruction messages comprise the test input data which is used by the JSM 111.

The test control station 113 may be an external device which is coupled directly to the MicroTCA hardware assembly 101. In other embodiments, the test control station 113 may for example be a remote device which is coupled to the MCH 109 through an external network such as for example of the Internet. Thus, specifically the test instruction messages can be Internet Protocol (IP) messages with the MCH 109 comprising an Internet interface having an assigned IP address to which the IP messages are addressed. This allows a flexible test approach and for example allows a manufacturer to perform dedicated tests on remotely deployed equipment.

In order to implement such an approach, it is necessary for the MicroTCA hardware assembly 101 to be able to provide an efficient interface between the external connection and the internal test functionality.

A possible solution is to include functionality in the MCH 109 which is arranged to terminate the test instruction messages and to feed the JTAG data to the JSM over a JTAG master interface. Although this approach may provide acceptable performance, it also has a number of disadvantages.

For example, implementing JTAG termination logic and JTAG drive logic in the MCH increases the cost and complexity of the MCH. Also, this is not sufficiently flexible to support the desired testability model without increased cost and complexity. Specifically, the approach results in an increased cost and complexity of the MCH 109 regardless of whether the provided test functionality is required or not.

In the MicroTCA hardware assembly 101 of FIG. 1, rather than having the remote JTAG/boundary scan traffic terminated in the MCH 109, the MCH 109 passes through the IP test instruction messages to the JSM 111. Thus, the termination and processing of data as well as the TAP controller command interpretation is performed on the JSM 111. The MCH 109 merely provides a pass through function for the test traffic and accordingly the MCH 109 needs only to support an additional interconnect switch port to the JSM 111 to pass remote JTAG traffic to this.

This allows a more flexible approach where the entire test functionality is concentrated on the JSM 111. Thus, the test functionality needs only to be included in MicroTCA hardware assemblies which have a requirement to support such test operations. Specifically, the approach allows a significantly reduced cost and complexity for the MCH 109.

This may reduce the cost of the final product and/or may increase the reliability of the MicroTCA hardware assembly 101.

Figure 2:
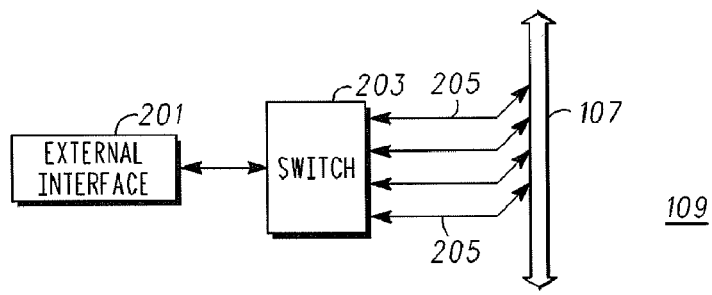
FIG. 2 illustrates an example of a block diagram of an interface module for a MicroTCA hardware assembly comprising a test system in accordance with some embodiments of the invention.

FIG. 2 illustrates the MCH 109 of FIG. 1 in more detail.

The MCH 109 comprises an external interface 201 which receives the test instruction messages from the remote test controller 113. The external interface 201 is coupled to a switch 203 which is furthermore coupled to the interconnect 107. Specifically, the switch 203 provides a plurality of ports 205 each of which corresponds to a virtual carrier on the interconnect 107. For example, the interconnect may be an Ethernet and the switch may be operable to associate each of the ports with a specific Ethernet address. Each of the modules may be assigned one or more Ethernet addresses and a switch 203 can switch data from one port to another thereby allowing communication from one Ethernet address to another and thus from one module to another.

In the MicroTCA hardware assembly 101 of FIG. 1, one of the ports of the switch 203 can be allocated to the JSM 111 and whenever a test instruction message is received by the external interface 201 this is switched to the port associated with the JSM 111 and thus forwarded to this.

In some embodiments, the external interface 201 and/or the switch 203 comprises functionality for encapsulating the incoming test instruction messages in messages that are suitable for communication over the interconnect 107. Thus, the external interface 201 can for example encapsulate an incoming test instruction message as an Ethernet message having the Ethernet address of the JSM 111 and can provide this to the switch 203 which then proceeds to switch it to the appropriate port.

In some embodiments, the JSM 111 may send a message to the MCH 109 to request that a port is assigned to it. In response, the MCH may allocate a port of the switch to the JSM 111. In some embodiments, the port may be associated with a specific communication resource allocation, such as a communication channel or a destination address, of the interconnect 107 and an identification of this communication resource allocation may be transmitted to the JSM 111.

Thus, the functionality and complexity of the MCH 109 is only marginally affected by the requirement for the test functionality provided by the JSM 111. Specifically, an external interface 201 is often required for maintenance and control of the MicroTCA hardware assembly 101 and accordingly the only additional requirement is that a port of the switch is allocated to the JSM 111.

Figure 3:
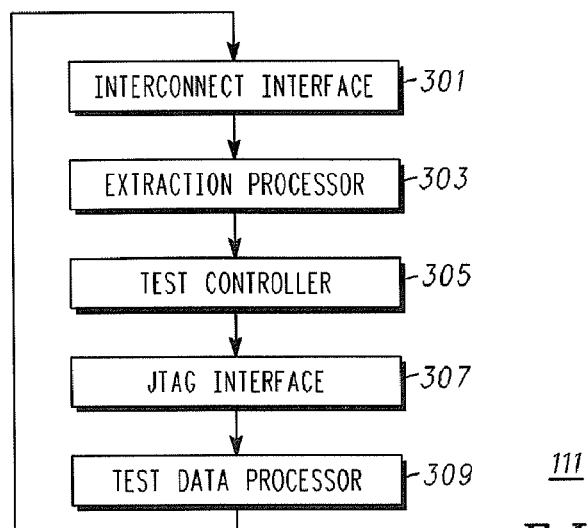
FIG. 3 illustrates an example of a block diagram of a test controller module for a MicroTCA hardware assembly comprising a test system in accordance with some embodiments of the invention.

FIG. 3 illustrates the JSM 111 of FIG. 1 in more detail.

The JSM 111 comprises an interconnect interface 301 which is arranged to communicate with the MCH 109 over the interconnect. The interconnect interface 301 is in the described example an Ethernet interface which can receive the Ethernet messages from the interconnect 107 and which specifically can receive the encapsulated test instruction messages that are forwarded by the MCH 109.

The interconnect interface 301 is coupled to an extraction processor 303 which is arranged to extract the test input data in the received interconnect Ethernet messages and in particular in the test instruction messages.

The extraction processor 303 is furthermore coupled to a test controller 305 which is arranged to perform tests of one or more of the modules of the MicroTCA hardware assembly 101. The test controller 305 is coupled to a JTAG interface which interfaces to the JTAG connections to the individual AMCs 103, 105.

The test controller 305 comprises a JTAG Test Access Port (TAP) controller which transmits the appropriate JTAG commands, data and instructions over the JTAG connection to the module under test.

In the example, the JTAG interface 307 is coupled to a plurality of different modules which can all be tested by the same TAP controller. The test instruction messages may contain test data which relates to a specific module, such as either the first AMC 103 or the second AMC 105. Specifically, the test instruction messages can comprise an identification of the module to which the test input data relates. This identification is extracted by the extraction processor 303 and fed to the test controller 305. The test controller 305 then proceeds to select the JTAG connection to the identified module and proceeds to transmit the JTAG data on this connection. Thus, the test controller 305 selects which module to apply the test input data to depending on the identification in the test instruction messages.

The test controller 305 can perform a number of different JTAG test procedures including boundary scans and fault insertion procedures. Depending on the specific test which is performed the test input data of the test instruction messages can therefore e.g. comprise one or more of the following:

Test instruction data. E.g. the data may comprise explicit JTAG test instructions which can be forwarded over the JTAG connection to the specific module.

Test vector data. E.g. the test input data may comprise test data that can be fed to the module under test in order to determine the response to different conditions. For example, a fault may be inserted and the response to the fault may be monitored.

Test program data. E.g. the test controller 305 can receive executable code which can directly implement a desired test functionality.

The JTAG interface 307 can furthermore receive JTAG test results data from the module(s) being tested. This test data is fed to a test data processor 309 which is coupled to the interconnect interface 301. The test data processor 309 can generate test output messages which comprise the test results data. These test output messages can be fed to the interconnect interface 301 and transmitted to the MCH 109 from where they can be transmitted to the test control station 113.

The transmission of the test output messages may be equivalent to the processing of the incoming test instruction messages in that they may merely be switched and forwarded by the MCH 109. For example an external network IP message can be encapsulated in an interconnect Ethernet message. The interconnect Ethernet message may be addressed to the external interface 205 which can then extract the encapsulated IP message and transmit this to the test control station 113 on the external network connection.

In the MicroTCA hardware assembly 101 of FIG. 1, the JTAG interface 307 can specifically support a JTAG connection to the MCH 109 which can be used to perform e.g. boundary scan tests of the MCH 109. However, as the MCH 109 does not need to comprise any test functionality beyond that which is required to test the MCH 109 itself, the JTAG connection between the JSM 111 and the MCH 109 may be a slave-only JTAG connection.

Thus, the MCH 109 may be treated by the JSM 111 as any other AMC card and JTAG tests may be performed using the same functionality and approach as for other modules. This may allow reduced complexity and facilitated operation.

In a MicroTCA system, the MCH 109 implements most of the central functionality which is required for the interworking and operation of the other modules of the assembly. Accordingly, a fault in the MCH 109 is likely to result in a failure of the entire assembly. Therefore, in some embodiments the JTAG may comprise two of more parallel MCHs in order to provide redundancy in case of failure.

Figure 4:
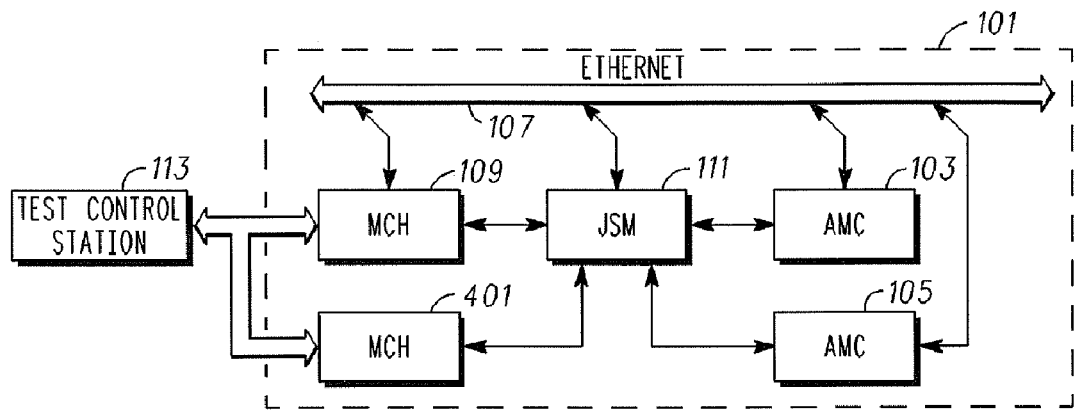
FIG. 4 illustrates an example of a block diagram of a MicroTCA hardware assembly comprising a test system in accordance with some embodiments of the invention.

FIG. 4 illustrates an example of a block diagram of a MicroTCA hardware assembly 101 comprising a test system in accordance with some embodiments of the invention. The assembly corresponds to the one of FIG. 1 with the addition of a second redundant MCH 401.

The redundant MCH 401 may be similar or identical to the first MCH 109. Specifically, it can also comprise an external interface for connecting to the test control station 113. Similarly, the connection may be a direct connection or may for example be a connection through an external network such as the Internet.

The second MCH 401 may be connected to the test control station 113 through the same connection as the first MCH 109 or through a different connection. For example, the test control processor 113 may transmit a single test instruction message in the form of an IP message addressed to a specific IP address and both the first and second MCHs 109, 401 may be arranged to receive IP messages for this IP address. As another example, the test control station 113 may transmit the test instruction messages independently to both the first and second MCH 109, 401.

The second MCH 401 also comprises a switch which has a number of ports coupled to the interconnect 107. In some embodiments, when the second MCH 401 receives a test instruction message, it forwards this to the JSM 111. Thus, the JSM 111 may in such an embodiment receive the same test instruction messages from the first MCH 109 and the second MCH 401 respectively.

In such a case, the JSM 111 may for example select one of the parallel test instruction messages, such as the test instruction messages received from the first MCH 109. In some embodiments, the JSM 111 may select test instruction messages from one of the MCHs 109, 401 depending on a status indication from the MCHs 109, 401. E.g. if one of the MCHs 109, 401 is indicated to have a potential fault, the test instruction messages from the other MCH may be used.

In some embodiments, the JSM 111 may monitor if the same test instruction messages are received from both of the MCHs 109, 401. If test instructions are only receive from one of the MCHs 109, 401 (or if different messages are received) this may be due to a fault in one of the MCHs 109, 401. Accordingly, if the test instruction messages are only received from one MCH 109, 401, the JSM 111 can comprise functionality for initiating a test of the MCH 109, 401 through which no test instruction messages are received (or can initiate a test of both MCHs 109, 401). This may allow improved fault detection and increase reliability of the MicroTCA hardware assembly 101.

Figure 5:
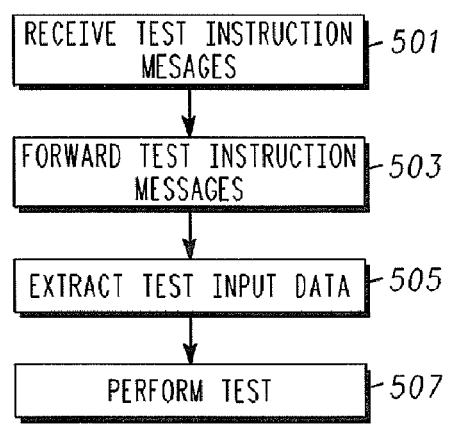
FIG. 5 illustrates an example of a method of testing for a MicroTCA test system in accordance with some embodiments of the invention.

FIG. 5 illustrates an example of a method of testing for a MicroTCA test system in accordance with some embodiments of the invention. The method is applicable to the MicroTCA hardware assembly 101 of FIG. 1.

The method initiates in step 501 wherein the MCH 109 receives test instruction messages from the external connection to the test control station 113. The test instruction messages comprise test input data for at least a first unit under test.

Step 501 is followed by step 503 wherein the MCH 109 forwards the received test instruction messages to the JSM 111 via the interconnect 107.

Step 503 is followed by step 505 wherein the JSM 111 extracts the test input data from the test instruction messages.

Step 505 is followed by step 507 wherein the JSM 111 performs a test of the first unit under test in response to the test input data.

It will be appreciated that the described system provides a number of advantages e.g. including one or more of the following:

It allows for test functionality, such as a JSM module with associated JTAG over e.g. IP support, to be added at a later stage so the up front investment can be reduced.
The reliance on the MCH for test purposes can be reduced.
The cost of the MCH may be reduced as it need not include additional complex test functionality. The cost of the test functionality is not increased by the provision of MCH redundancy.
Core JTAG traffic termination and processing can be decoupled from the MCH.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims does not imply any specific order in which the features must be worked and in particular the order of individual steps in a method claim does not imply that the steps must be performed in this order. Rather, the steps may be performed in any suitable order.

The invention claimed is:

1. A Micro Telecommunications Computing Architecture, MicroTCA, test system comprising:
    an interconnect for communication between modules of the MicroTCA test system;
    a test controller module coupled to the interconnect and comprising an interface for coupling to at least a first unit under test; and
    an interface module coupled to the interconnect and arranged to receive test instruction messages from an external connection and comprising a forwarding controller arranged to forward the received test instruction messages to the test controller module via the interconnect, the test instruction messages comprising test input data for at least a first unit under test; and
    wherein the test controller module furthermore comprises
        a extraction processor for extracting the test input data from the test instruction messages; and
        a test controller for performing a test of the first unit under test in response to the test input data.

2. The MicroTCA test system of claim 1 wherein the test input data comprises Joint Test Action Group, JTAG, test input data and the test controller comprises a JTAG Test Access Port controller.

3. The MicroTCA test system of claim 1 wherein the first unit under test comprises the interface module.

4. The MicroTCA test system of claim 3 wherein the test controller is arranged to test the interface module over a JTAG slave only connection.

5. The MicroTCA test system of claim 1 wherein the test controller comprises a boundary scan test module for performing a boundary test of the first unit under test.

6. The MicroTCA test system of claim 1 wherein the test controller module is coupled to a plurality of units under test; and wherein the test controller is arranged to select the first unit in response to a unit identification comprised in the test instruction messages.

7. The MicroTCA test system of claim 1 wherein the interface module comprises a switch for switching data between ports, at least a first port of the switch being coupled to the external connection; and
    a switch controller arranged to receive a port request from the test controller module and in response allocating a second port to the test controller module and controlling the switch to forward the test instruction messages from the first port to the second port.

8. The MicroTCA test system of claim 7 wherein the switch controller is furthermore arranged to associate the first port with a communication resource allocation of the interconnect and to communicate an identification of the communication resource allocation to the test controller module.

9. The MicroTCA test system of claim 1 further comprising a redundant interface module coupled to the interconnect and arranged to receive the test instruction messages from the external connection and comprising a forwarding controller arranged to forward the received test instruction messages to the test controller switch module via the interconnect.

10. The MicroTCA test system of claim 9 wherein the extraction processor comprises selection means for selecting between the test instruction messages from the interface module and the redundant interface module.

11. The MicroTCA test system of claim 9 wherein the extraction processor is arranged to detect that test input data messages are received from only one of the interface module and the redundant interface module and the test controller is arranged to initiate a test of at least one of the interface module and the redundant interface module in response to the detection.

12. The MicroTCA test system of claim 1 wherein the test instruction messages are Internet Protocol messages comprising encapsulated test input data.

13. The MicroTCA test system of claim 1 wherein the interconnect is an Ethernet interconnect.

14. The MicroTCA test system of claim 1 wherein the interface module is a MicroTCA Carrier Hub module.

15. The MicroTCA test system of claim 1 wherein the test controller module is a MicroTCA Joint Test Action Group, JTAG, Switch Module.

16. The MicroTCA test system of claim 1 wherein the test input data comprises at least one of:
    test instruction data;
    test vector data; and
    test program data.

17. A method of testing for a Micro Telecommunications Computing Architecture, MicroTCA, test system including an interconnect for communication between modules of the MicroTCA test system; a test controller module coupled to the interconnect and comprising an interface for coupling to at least a first unit under test; and an interface module coupled to the interconnect and an external connection; the method comprising:
    the interface module receiving test instruction messages from the external connection, the test instruction messages comprising test input data for at least a first unit under test;
    the interface module forwarding the received test instruction messages to the test controller module via the interconnect;
    the test controller module extracting the test input data from the test instruction messages; and
    the test controller module performing a test of the first unit under test in response to the test input data.

* * * * *